(12) United States Patent
Suzuki et al.

(10) Patent No.: US 7,534,695 B2
(45) Date of Patent: May 19, 2009

(54) METHOD OF MANUFACTURING A SEMICONDUCTOR DEVICE

(75) Inventors: Kazushi Suzuki, Toyko (JP); Hiroshi Yoshino, Tokyo (JP); Yoshihiro Takaishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 70 days.

(21) Appl. No.: 11/890,425

(22) Filed: Aug. 6, 2007

(65) Prior Publication Data

US 2008/0038897 A1 Feb. 14, 2008

(30) Foreign Application Priority Data

Aug. 8, 2006 (JP) ............... P2006-215632

(51) Int. Cl.
*H01L 21/76* (2006.01)
*H01L 21/8242* (2006.01)
*H01L 27/108* (2006.01)

(52) U.S. Cl. ............... 438/401; 257/797; 257/E23.179; 257/68

(58) Field of Classification Search ................ 438/401; 257/797, 301, E23.179
See application file for complete search history.

(56) References Cited

U.S. PATENT DOCUMENTS 6,756,691 B2* 6/2004 Tomita et al. ............... 257/797

2007/0032015 A1* 2/2007 Itoh et al. ................... 438/250

FOREIGN PATENT DOCUMENTS

| JP | 7-321227    | 12/1995 |
| JP | 9-82669     | 3/1997  |
| JP | 11-354400   | 12/1999 |
| JP | 2001-036036 | 2/2001  |
| JP | 2004-214568 | 7/2004  |

* cited by examiner

*Primary Examiner*—Kiesha L Rose
*Assistant Examiner*—Aaron A Dehne
(74) *Attorney, Agent, or Firm*—Scully, Scott, Murphy & Presser, P.C.

(57) ABSTRACT

A semiconductor-device manufacturing method includes forming an element separating insulating film on a semiconductor substrate; forming a gate multilayer film for forming a gate electrode thereon; removing the gate multilayer film in an alignment mark forming area positioned on the element separating insulating film; forming a pattern of a first conductive film in the element forming area; forming an alignment mark of the first conductive film, used in photolithography, in the alignment mark forming area surrounded by the gate multilayer film; forming an inter-layer insulating film thereon; removing the inter-layer insulating film in the alignment mark forming area, so that it remains on the gate multilayer film around the alignment mark forming area; removing or thinning the element separating insulating film around the alignment mark; and forming a pattern of a second conductive film on the inter-layer insulating film by performing alignment of the photolithography by using the alignment mark.

5 Claims, 6 Drawing Sheets

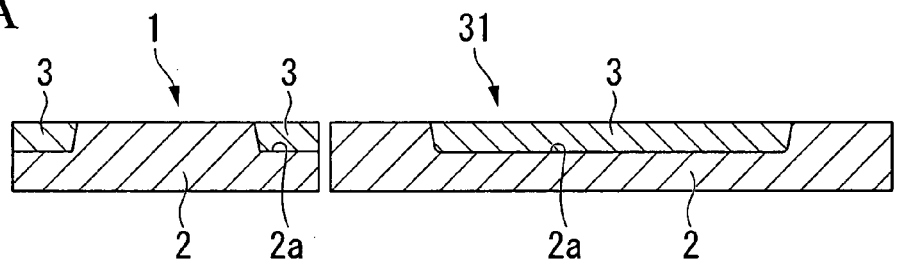
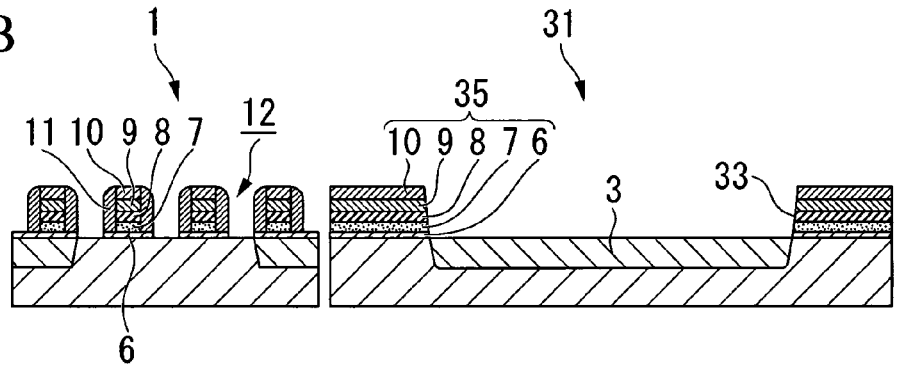
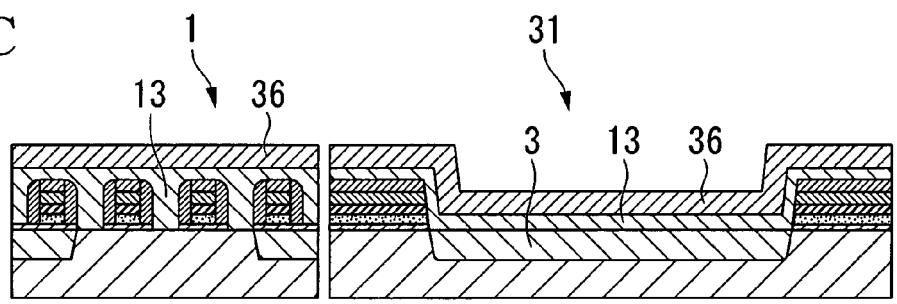
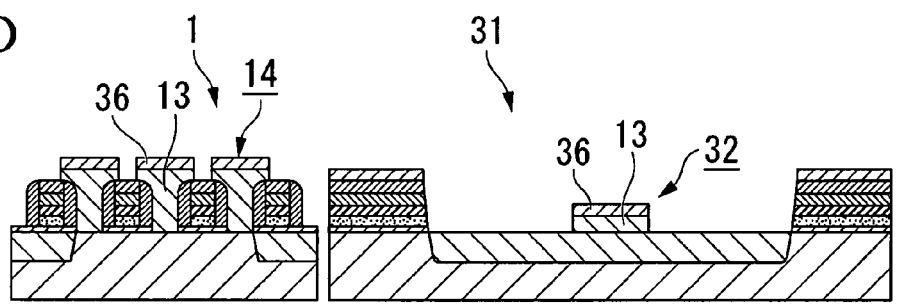
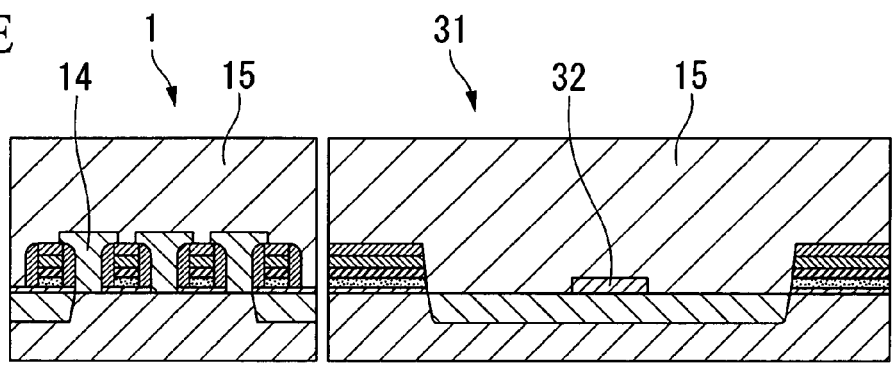

METHOD OF MANUFACTURING A SEMICONDUCTOR DEVICE

BACKGROUND OF THE INVENTION

1. Field of the Invention

The present invention relates to a method of manufacturing a semiconductor device, in particular, a method of forming an alignment mark used in a photolithography process, which is one of the processes of manufacturing a semiconductor device.

Priority is claimed on Japanese Patent Application No. 2006-215632, filed Aug. 8, 2006, the content of which is incorporated herein by reference.

2. Description of the Related Art

Semiconductor devices such as a DRAM (dynamic random access memory) are manufactured by repeatedly performing a process of forming a wiring layer, a process of forming contact plugs for connecting upper and lower wiring lines, and the like, so as to form a plurality of wiring layers. For example, in order to reliably connect the upper and lower wiring lines via contact plugs, alignment (positioning) is necessary for preventing an offset between the connection position between lower-layer wiring and a contact plug therefor, and the connection position between corresponding upper-layer wiring and a contact plug therefor. Generally, in order to perform such alignment, alignment marks are formed on both (i) a reticle (i.e., a mask for exposure) on which circuit patterns are formed, and (ii) a semiconductor substrate. Alignment marks on the reticle are formed in advance when the reticle is fabricated. In contrast, alignment marks on the semiconductor substrate are formed in accordance with the progress of relevant processes, for example, in the vicinity of a scribe line, outside the element forming area.

Recently, detection of each alignment mark on the semiconductor substrate has been made difficult, due to (i) often performing a surface planarization process using a CMP (chemical mechanical polishing) technique, accompanied with fine structures of semiconductor devices, (ii) often using metal wiring materials which have no transparency, (iii) thin-filming with respect to a layer on which alignment marks are formed, or the like.

More specifically, in the alignment process, each alignment mark is optically read using an exposure apparatus such as a stepper. In this process, a step should be provided between the alignment mark and the periphery thereof, and the alignment mark should have a well-shaped form to a certain degree. If such conditions are not satisfied, the optical reading accuracy may be degraded, and reading itself may not be executed.

Patent Document 1 discloses a method of reliably detecting alignment marks. Patent Document 1 discloses an example of alignment marks, which have substantially the same structure as the gate of a MOS transistor, and which is used when performing alignment of a bit-line layer with respect to the gate. In this structure, a hollow part (called a "mark hole" in Patent Document 1) is formed in an inter-layer insulating film on a semiconductor substrate, so as to expose a surface of the substrate, and an alignment mark having the same structure as the gate is formed on the bottom face of the hollow part (i.e., on the surface of the semiconductor substrate). In accordance with this structure, even when a CMP process is applied on the upper surface of the inter-layer insulating film, the alignment mark, positioned on the bottom face of the hollow part, is not affected by the CMP process, thereby reliably detecting the alignment mark having a required step around it.

Patent Document 1: Japanese Unexamined Patent Application, First Publication No. 2001-36036.

However, generally, a plurality of alignment marks are arranged, each of which may have a rectangular pattern and a size of a few to dozens of micrometers. Therefore, when the technique disclosed in Patent Document 1 is applied to such alignment marks, the hollow part, formed by opening a part of the inter-layer insulating film, may have a length dimension greater than 100 µm in plan view. In this case of having a wide opening, even when alignment marks are positioned on the bottom face of the hollow part, it may be affected by the CMP process, and uneven polishing called "dishing" may occur, so that the step around each mark may be lowered, or the form of each mark may be deformed. In addition, even when the size of the opening is not so large, if the thickness of the inter-layer insulating film decreases in accordance with further fining of the semiconductor device, alignment marks may still be affected by the CMP process.

On the other hand, the alignment marks disclosed in Patent Document 1 have a considerable height, by which they tend to be affected by the CMP process. If the marks are made thinner so as to increase the distance between the upper surface of the inter-layer insulating film and the upper surface of the alignment mark, the alignment mark may be less affected by the CMP process. However, as described above, when the step of each alignment mark is lowered, detection of the alignment mark itself is difficult. That is, conventional techniques cannot simultaneously satisfy both (i) removal of affection of the CMP process on alignment marks, and (ii) reliable detection of alignment marks.

SUMMARY OF THE INVENTION

In light of the above circumstances, an object of the present invention is to provide a method of manufacturing a semiconductor device, by which (i) affection of the CMP process on alignment marks can be removed, and (ii) detection of the alignment marks can be reliably performed.

Therefore, the present invention provides a method of manufacturing a semiconductor device, in which on a semiconductor substrate, semiconductor elements are formed in an element forming area and an alignment mark used in photolithography is formed outside the element forming area, the method comprising the steps of:

forming an element separating insulating film on the upper surface of the semiconductor substrate;

forming a gate multilayer film for forming a gate electrode on the upper surface of the semiconductor substrate, which includes the area where the element separating insulating film is formed;

selectively removing the gate multilayer film in an alignment mark forming area, which is positioned on the element separating insulating film, so that the gate multilayer film remains around the alignment mark forming area;

forming a pattern, made by using a first conductive film, in the element forming area on the upper surface of the semiconductor substrate, and also forming the alignment mark made by using the first conductive film in the alignment mark forming area surrounded by the gate multilayer film;

forming an inter-layer insulating film on the upper surface of the semiconductor substrate after the pattern and the alignment mark are formed;

selectively removing the inter-layer insulating film in the alignment mark forming area, so that the inter-layer insulating film remains on the gate multilayer film around the alignment mark forming area;

removing or thinning the element separating insulating film around the alignment mark;

forming a pattern, made by using a second conductive film, on the inter-layer insulating film by performing alignment of the photolithography by using the alignment mark.

Preferably, the step of removing or thinning the element separating insulating film around the alignment mark is performed immediately after the selective removal of the inter-layer insulating film in the alignment mark forming area.

Accordingly, the step of removing or thinning the element separating insulating film around the alignment mark is performed successively after the selective removal of the inter-layer insulating film in the alignment mark forming area, thereby resulting in rationalization and reduction of manufacturing processes.

Also preferably, the step of selectively removing the gate multilayer film in the alignment mark forming area is performed simultaneously with patterning of the gate multilayer film so as to form the gate electrode.

In this case, it is unnecessary to separately perform the step of selectively removing the gate multilayer film in the alignment mark forming area, thereby resulting in rationalization and reduction of the manufacturing processes.

More specifically, it is possible that:

a word wiring line is formed using the gate multilayer film;

a memory cell contact plug, connected to an impurity-diffused layer in the upper surface of the semiconductor substrate, is formed using the pattern made by the first conductive film; and a bit wiring contact plug, connected to the memory cell contact plug, is formed using the pattern made by the second conductive film.

Accordingly, it is possible to form the bit wiring contact plug, which is aligned accurately with the memory cell contact plug.

In this case, preferably, the step of selectively removing the inter-layer insulating film in the alignment mark forming area is performed simultaneously with formation of a contact hole for connecting the bit wiring contact plug to the memory cell contact plug through the inter-layer insulating film.

In this case, it is unnecessary to separately perform the step of selectively removing the inter-layer insulating film in the alignment mark forming area, thereby resulting in rationalization and reduction of the manufacturing processes.

In accordance with the present invention, the gate multi-layer film and the inter-layer insulating film are stacked around the alignment mark forming area, and thus the alignment mark forming area is provided on the bottom face (i.e., the upper surface of the element separating insulating film) of a hollow part, which is formed by selectively removing a part of the gate multilayer film and the inter-layer insulating film. In addition, the alignment mark itself is formed only by the first conductive film. Therefore, a sufficient distance can be provided between the upper surface of the inter-layer insulating film and the upper surface of the alignment mark. Accordingly, when the inter-layer insulating film is subjected to a CMP process, the alignment mark is little affected by the CMP process. Furthermore, as the element-separating insulating film around the alignment mark is removed, a sufficient step is provided between the alignment mark and the periphery around it. Therefore, affection of the CMP process on the alignment mark can be removed, and simultaneously, detection of the alignment marks, made by using the first conductive film, can be reliably performed when forming the pattern of the second conductive film. Accordingly, it is possible to manufacture a semiconductor device in which the first conductive film aligns with the second conductive film accurately.

BRIEF DESCRIPTION OF THE DRAWINGS

FIGS. 3A to 3E are sectional views for explaining sequential manufacturing processes of the DRAM.

DETAILED DESCRIPTION OF THE INVENTION

Hereinafter, an embodiment in accordance with the present invention will be described with reference to the appended FIGS. 1 to 4.

The semiconductor device of the present embodiment is a DRAM, and the present embodiment employs alignment marks used in the alignment of bit wiring contact plugs with respect to memory cell contact plugs, which is performed in photolithography in a process of forming the bit wiring contact plugs.

Figure 1:
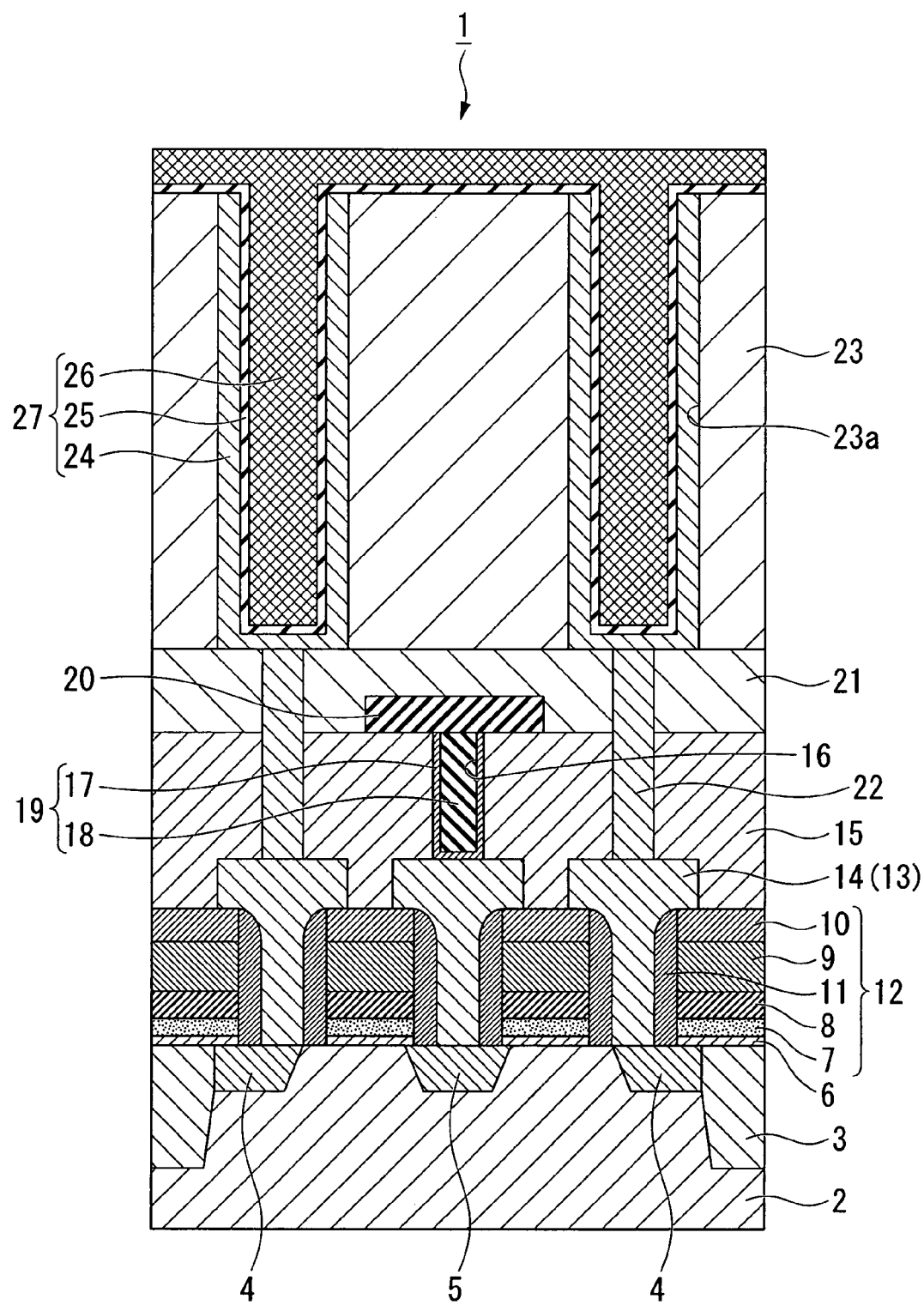
FIG. 1 is a sectional view showing a memory cell part of a DRAM with respect to an embodiment of the present invention.
Figure 2:
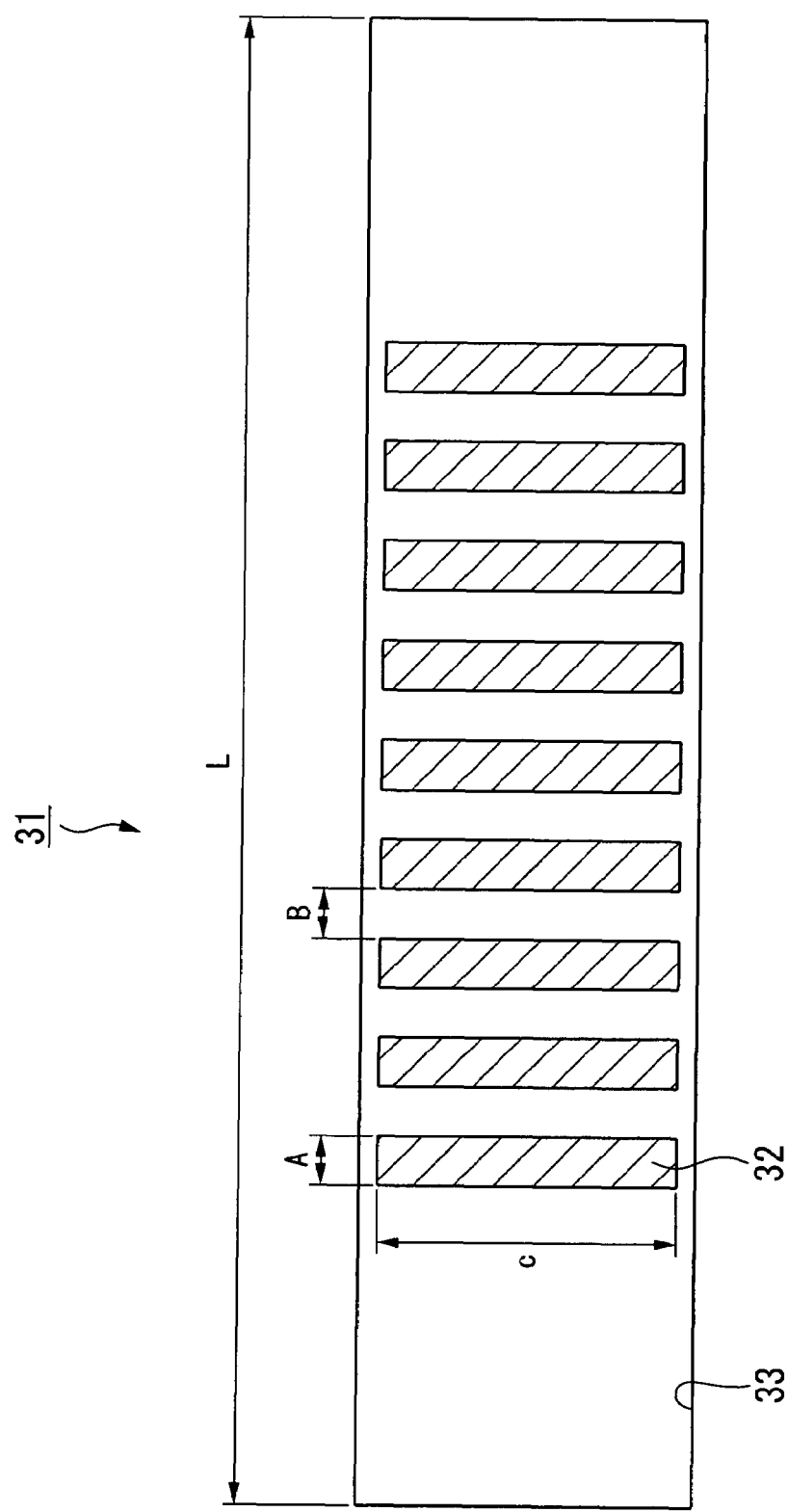
FIG. 2 is a plan view showing the pattern of alignment marks for the DRAM in the embodiment.

FIG. 1 is a sectional view showing a memory cell part of the DRAM in the present embodiment. FIG. 2 is a plan view showing the pattern of alignment marks for the DRAM. FIGS. 3A to 3E and FIGS. 4A to 4D are sectional views for explaining sequential manufacturing processes of the DRAM. In each of FIGS. 3A to 3E and FIGS. 4A to 4D, (i) sectional structures of the memory cell part (shown in FIG. 1) and an alignment mark part formed outside the element forming are shown in contrast, and (ii) only one alignment mark is shown for convenience of explanation.

As shown in FIG. 1, in a memory cell part 1 (i.e., element forming area) of the DRAM in the present embodiment, element-separating insulating films 3 made by using a silicon oxide film, and sources 4 and a drain 5, which are made by using an impurity-diffused layer, are formed on a semiconductor substrate 2. On the upper surface of the semiconductor substrate 2, a gate insulating film 6 is formed, on which word wiring lines 12 are formed, which include (i) a first silicon film 7 made of polysilicon, (ii) a metal film 8 made of tungsten or the like, (iii) a silicon nitride film 9, (iv) a silicon oxide film 10, and (v) side wall insulating films 11. In addition, memory cell contact plugs 14 are formed by using a second silicon film 13, which is electrically connected with the sources 4 and the gate 5. A first inter-layer insulating film 15 is formed so as to surround the memory cell contact plugs 14 In the first inter-layer insulating film 15, a bit wiring contact hole 16 is formed, so as to connect a bit wiring line 20 in an upper layer to a corresponding memory cell contact plug 14. The bit wiring contact hole 16 is filled with a titanium nitride film 17 and a tungsten film 18, which form a bit wiring contact plug 19. A titanium film may be formed under the titanium nitride film 17. On the bit wiring contact plug 19, a bit wiring line 20 is formed using a tungsten film or the like. On the first inter-layer insulating film 15, a second inter-layer insulating film 21 is formed so as to cover the bit wiring line 20. In addition, capacitor contact plugs 22, passing through the first inter-layer insulating film 15 and the second inter-layer insulating film 21, are formed so as to connect capacitors 27 in an upper layer to the corresponding memory cell contact plugs 12. On the second inter-layer insulating film 21, a third inter-layer insulating film 23 is formed, in which deep holes 23a are formed so as to expose the upper surfaces of the capacitor contact plugs 22. In each deep hole 23a, a capacitor 27 is formed, which consists of a lower electrode 24, a dielectric film 25, and an upper electrode 26.

On the other hand, in a periphery (i.e., outside the element forming area) of each chip as a constituent of the DRAM, an alignment mark part 31 (i.e., an alignment mark forming area) is provided (see FIG. 2). In the alignment mark part 31 in FIG. 2, alignment marks 32 are formed, which belong to the same layer as that of the memory cell contact plugs 14. The alignment mark part 31 is positioned in a hollow part 33, which is formed by selectively removing a part of a gate multilayer film (explained later) and the first inter-layer insulating film 15. The alignment mark part 31 has a rectangular form in plan view, having a width L (on the longer side) of 180 μm. Although it is not shown in the plan view, the alignment mark part 31 in the present embodiment has a distinctive feature such that it is formed in an area where an element-separating insulating film 3 is originally formed.

In the alignment mark part 31, a plurality of alignment marks 32 (9 marks in the shown example) are formed, each having a rectangular form. Each alignment mark 32 has a width A (on the shorter side) of 6 μm, and a length C (on the longer side) of 45 μm, and the interval B between adjacent alignment marks 32 is 6 μm. In contrast to that the width of the above-described word wiring line 12 or the bit wiring line 20 is approximately 0.1 μm, the alignment mark part 31 occupies a considerably large area.

Below, manufacturing processes of the DRAM having the above structure will be explained with reference to FIGS. 3A to 3E, and FIGS. 4A to 4D.

As shown in FIG. 3A, in the first process, each element-separating insulating film 3 is formed by a known method in a specific area on the upper surface of the semiconductor substrate 2, which is made of p-type single-crystal silicon. Specifically, after a silicon oxide film and a silicon nitride film (both not shown) are formed on the upper surface of the semiconductor substrate 2, the silicon nitride film, the silicon oxide film, and the semiconductor substrate 2 are dry-etched using a photo resist (not shown) as a mask, thereby forming each hollow part 2a, whose depth is 250 to 300 nm, in an element-separating area of the semiconductor substrate 2. After that, an silicon oxide film having a thickness of 300 to 350 nm is deposited on the semiconductor substrate 2, and the upper surface of the silicon oxide film is made flat by the CMP method using the silicon nitride film as a stopper. Accordingly, each hollow part 2a, formed in the element-separating area in the semiconductor substrate 2, is filled with the silicon oxide film, thereby forming each element-separating insulating film 3 made by the silicon oxide film.

Generally, in order to fill a hollow part in an element-separating area of the memory cell part with an insulating film, the size of the hollow part is not so large. In this case, when forming an insulating film having a thickness greater than half of the size of the opening (in plan view) of the hollow part, insulating films, which grow from both side walls, contact each other at the center of the hollow part, so that the whole inside of the hollow part is filled with the insulating film. In contrast, in the present embodiment, the element-separating insulating film forming area in the alignment mark part 31 is considerably large in comparison with the element-separating insulating film forming area in the memory cell part 1. Thus, the hollow part 2a may not be filled with an insulating film having a thickness half of the opening size of the hollow part 2a in the memory cell part 1. However, as described above, when an insulating film is formed, which is sufficiently thick with respect to the depth of the hollow part 2a, and then planarization is performed using CMP, the hollow part 2a in the alignment mark part 31 can be sufficiently filled with the insulating film.

Next, as shown in FIG. 3B, the gate insulating film 6 having a thickness of 4 nm is formed on the upper surface of the semiconductor substrate 2 by thermal oxidation. After that, the first silicon film 7 having a thickness of 70 nm is formed by means of a known CVD (chemical vapor deposition) method using monosilane ($SiH_4$) as a source gas. The first silicon film 7 may be a polysilicon film in which n-type impurities have been doped.

In the next step, the metal film 8, which has a three-layer structure consisting of a tungsten silicide film, a tungsten nitride film, and a tungsten film (one layer including the three layers is shown in the drawings), is formed by means of a known sputtering method. Here, the tungsten silicide film has a thickness of 5 nm, the tungsten nitride film has a thickness of 10 nm, and the tungsten film has a thickness of 80 nm.

In the next step, the silicon nitride film 9 having a thickness of 120 nm is formed by means of a known CVD method using monosilane and ammonia ($NH_3$) as source gases, and the silicon oxide film 10 having a thickness of 80 nm is further deposited by means of a known CVD method using monosilane and dinitrogen monoxide ($N_2O$) as source gases.

In the present specification, the gate insulating film 6, the first silicon film 7, the metal film 8, the silicon nitride film 9, and the silicon oxide film 10 are generally called a "gate multilayer film 35". As described above, the metal film 8 is a multilayer film consisting of a tungsten film, a tungsten nitride film, and a tungsten silicide film, and will be written as a "W/WN/WSi film" below.

Next, the silicon oxide film 10, the silicon nitride film 9, the W/WN/WSi film 8, the first silicon film 7, and the gate insulating film 6 are subjected to patterning using photolithography and dry etching. In this process, also in the alignment mark part 31, similar patterning is performed so as to selectively remove a part of the gate multilayer film 35 by using a rectangular pattern as shown in FIG. 2, thereby forming a hollow part 33 in which the surface of the element-separating insulating film 3 is exposed. Then, after a silicon nitride film having a thickness of 30 nm is formed on the entire surface of the device, it is subjected to etchback, so as to form the side wall insulating films 11 made of the silicon nitride film, thereby forming the word wiring lines 12. In addition, although it is not shown in the drawings, before or after the side wall insulating films 11 are formed, an impurity-diffused layer is formed on the surface of the semiconductor substrate 2 by implantation, so as to form each source 4, drain 5, or the like.

After the word wiring lines 12 are formed, as shown in FIG. 3C, the second silicon film 13 (i.e., a first conductive film) having a thickness of 80 nm is formed on the entire surface by CVD, and a silicon oxide film 36 having a thickness of 120 nm is further deposited. The second silicon film 13 may be a polysilicon film into which n-type impurities (e.g., phosphorus) have been doped. At present, in the alignment mark part 31, the second silicon film 13 and the silicon oxide film 36 are stacked on the element-separating insulating film 3.

Next, as shown in FIG. 3D (see the memory cell part 1), the silicon oxide film 36 and the second silicon film 13 are subjected to patterning by means of photolithography and dry etching, so as to form the memory cell contact plugs 14. More specifically, in order to form the memory cell contact plugs 14, the silicon oxide film 36 is first etched using a photoresist pattern (not shown) as a mask, which is formed by photolithography, and then the second silicon film 13 is etched using the silicon oxide film 36 as a mask. The etching of the silicon oxide film 36 may be performed using a gas plasma of trifluoromethane ($CHF_3$), and the etching of the second silicon film 13 may be performed using a gas plasma of hydrogen bromide (HBr). On the other hand, in the alignment mark part 31, the silicon oxide film 36 and the second silicon film 13 are subjected to patterning so as to form each alignment mark 32 in which the silicon oxide film 36 is stacked on the second silicon film 13.

Next, as shown in FIG. 3E, a silicon oxide film having a thickness of 500 nm is formed as the first inter-layer insulating film 15 on the entire surface by means of an HDP (high density plasma) method, so as to bury the memory cell contact plugs 14 and each alignment mark 32. The surface of the first inter-layer insulating film 15 is then made flat by CMP. Instead of forming the first inter-layer insulating film 15 by a single silicon oxide film, a multilayer film may be formed, which consists of, from the substrate side, a silicon oxide film having a thickness of 400 nm, a blanket nitride film having a thickness of 9 nm, which are formed by HDP, and a silicon oxide film having a thickness of 80 nm, which is formed by a plasma CVD method. In another variation, after the first inter-layer insulating film 15 is formed so as to bury the memory cell contact plugs 14, CMP may be performed until the upper surfaces of the memory cell contact plugs 14 are exposed, and an inter-layer insulating film may be further deposited thereon.

Figure 4A:
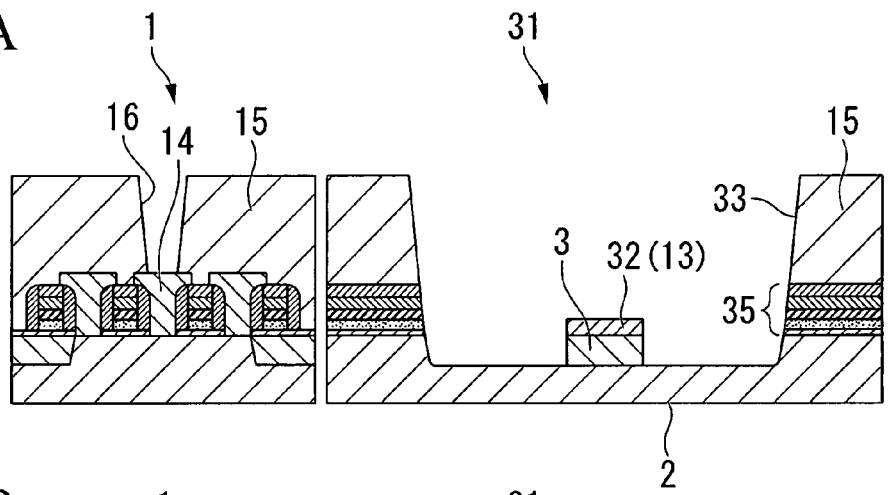
FIGS. 4A to 4D are also sectional views for explaining the sequential manufacturing processes.

Next, as shown in FIG. 4A, a part of the first inter-layer insulating film 15 is selectively removed by photolithography and dry etching, so as to form the bit wiring contact hole 16 in the memory cell part 1. Simultaneously, in the alignment mark part 31, the hollow part 33 is formed by selectively removing a part of the first inter-layer insulating film 15. During the photolithography in this process, the alignment mark 32 is covered only by the first inter-layer insulating film 15 which is transparent with respect to visible light. Therefore, the alignment mark 32 can be used for alignment performed in an exposure process for forming the bit wiring contact hole 16.

During the dry etching in the above process, the first inter-layer insulating film 15 in the alignment mark part 31 is etched while the bit wiring contact hole 16 passes through the first inter-layer insulating film 15 and reaches the upper surface of the relevant memory cell contact plug 14. In the present embodiment, overetching for further performing etching other than the etching corresponding to the thickness of the first inter-layer insulating film 15 is executed in the alignment mark part 31, so as to etch a total thickness of approximately 800 nm or larger. Accordingly, in the alignment mark part 31, in addition to the first inter-layer insulating film 15, the element-separating insulating film 3 is also etched, which is made by a silicon oxide film, similar to the first inter-layer insulating film 15. With respect to the part of each alignment mark 32, the second silicon film 13 as a constituent of the alignment mark 32 functions as a mask during the etching, so that the element-separating insulating film 3 immediately below the second silicon film 13 remains, while the element-separating insulating film 3 around the second silicon film 13 is removed. More specifically, dry etching may be performed using a gas plasma, which includes octafluoro cyclopentane ($C_5F_8$), trifluoromethane, oxygen, and argon. By using this gas plasma, the silicon oxide film can be etched with respect to the silicon film, with a preferable selectivity.

Figure 4B:
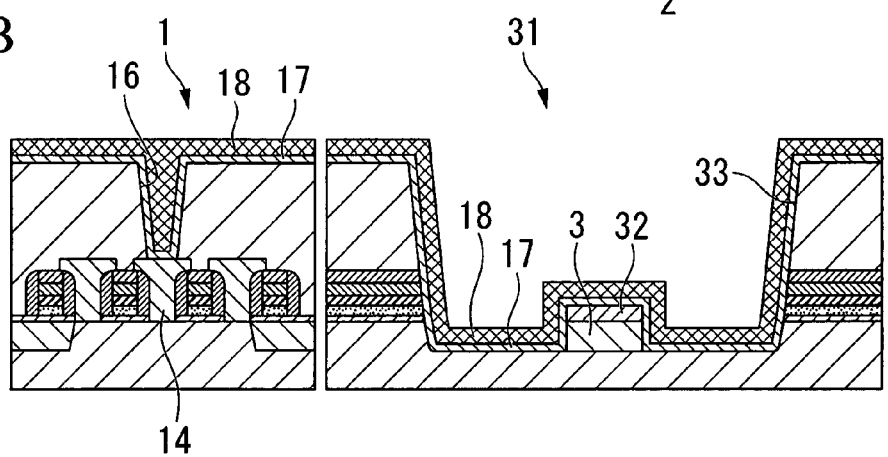

Next, as shown in FIG. 4B, the titanium nitride film 17 having a thickness of 25 nm, and the tungsten film 18 (i.e., a second conductive film) having a thickness of 200 nm are deposited in turn, so as to fill and bury the bit wiring contact hole 16. The titanium nitride film 17 is formed by CVD using titanium tetrachloride ($TiCl_4$) and ammonia as source gases. However, before the formation of the titanium nitride film 17, titanium is deposited only using titanium tetrachloride in an initial step with respect to the film formation, so as to form a titanium silicide layer (not shown) on the surface of the relevant memory cell contact plug 14. In addition, as the hollow part 33 in the alignment mark part 31 has a large area, it is not filled with the tungsten film having the above-described thickness, so that the titanium nitride film 17 and the tungsten film 18 are formed in a manner such that the original forms of relevant films and each alignment mark 32 appear inside and outside the hollow part 33, and the step of each alignment mark 32 is secured.

Figure 4C:
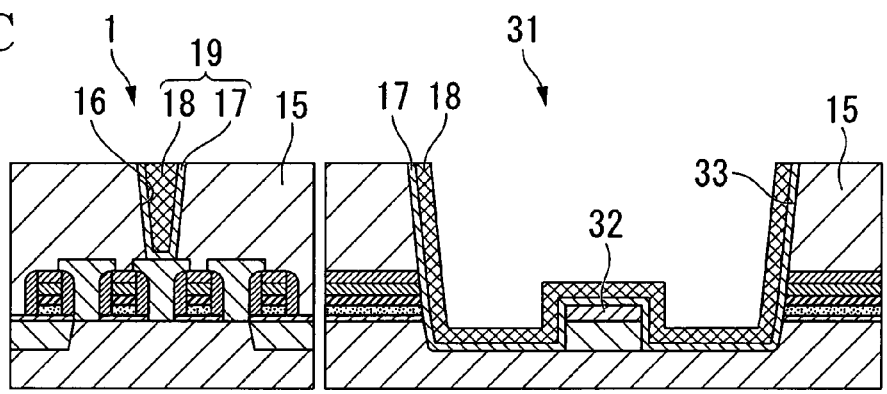

Next, as shown in FIG. 4C, the tungsten film 18 and the titanium nitride film 17 on the first inter-layer insulating film 15 are removed using CMP, while they remain inside the bit wiring contact hole 16, thereby forming the bit wiring contact plug 19 in the memory cell part 1. In the alignment mark part 31, the tungsten film 18 and the titanium nitride film 17 remain along the inner face of the hollow part 33.

Figure 4D:
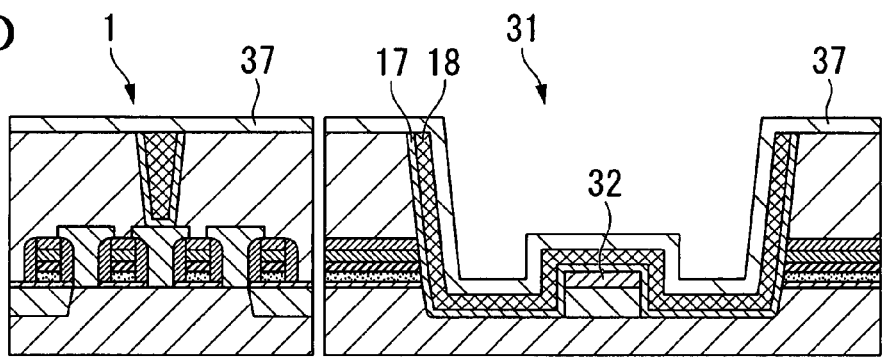

Next, as shown in FIG. 4D, a tungsten film 37 having a thickness of 70 nm is formed on the entire surface. After that, the tungsten film 37 is subjected to patterning by means of photolithography and dry etching, so as to form the bit wiring line 20. In this process, the alignment mark 32, whose step is secured by the tungsten film 18 and the titanium nitride film 17, can be used in alignment, which is performed in an exposure process for forming the bit wiring line 20.

The following processes are performed by known methods. That is, the second inter-layer insulating film 21 is formed so as to cover the bit wiring line 20, and the capacitor contact plugs 22 are formed by forming capacitor contact holes, which pass through the second inter-layer insulating film 21 and the first inter-layer insulating film 15, and then filling the capacitor contact holes with a metal film or the like. Then, the third inter-layer insulating film 23 is formed on the second inter-layer insulating film 21, and the deep holes 23a are formed in the third inter-layer insulating film 23, so as to expose the upper surfaces of the capacitor contact plugs 22. In each deep hole 23a, the capacitor 27 is formed, which consists of the lower electrode 24, the dielectric film 25, and the upper electrode 26. The DRAM of the present embodiment is finished through the above-described processes.

In accordance with the method of manufacturing a semiconductor device in the present embodiment, as shown in FIG. 4A, the gate multilayer film 35 and the first inter-layer insulating film 15 are stacked around the alignment mark part 31, and each alignment mark 32 is provided on the bottom face of the hollow part 33, which is formed by removing a part of the gate multilayer film 35 and the first inter-layer insulating film 15. In addition, the alignment mark 32 itself is formed only by the second silicon film 13, which also forms the memory cell contact plugs 14, and only the element-separating insulating film 3 is present under the alignment mark 32. Therefore, the height of the alignment mark 32 is small, and a sufficient distance can be provided between the upper surface of the first inter-layer insulating film 15 and the upper surface of each alignment mark 32. Accordingly, when the first inter-layer insulating film 15 is subjected to a CMP process, each alignment mark 32 is little affected by the CMP process. Furthermore, as the element-separating insulating film 3 around each alignment mark 32 is removed, a sufficient step is provided between the alignment mark 32 and the periphery around it.

Accordingly, it is possible to reliably detect each alignment mark 32 while removing the influence of the CMP process on the alignment mark 32, and thus it is possible to form each bit wiring contact plug 19, whose position is very accurately adjusted to the corresponding memory cell contact plug 14. The above explanation has been focused on the alignment between the corresponding memory cell contact plug 14 and the corresponding bit wiring contact plug 19. However, the alignment mark 32 in the present embodiment can also be applied to alignment of any other layer. In this case, positioning accuracy between relevant layers can be improved, so that DRAMs having high reliability can be manufactured with a superior yield.

Figure 6:
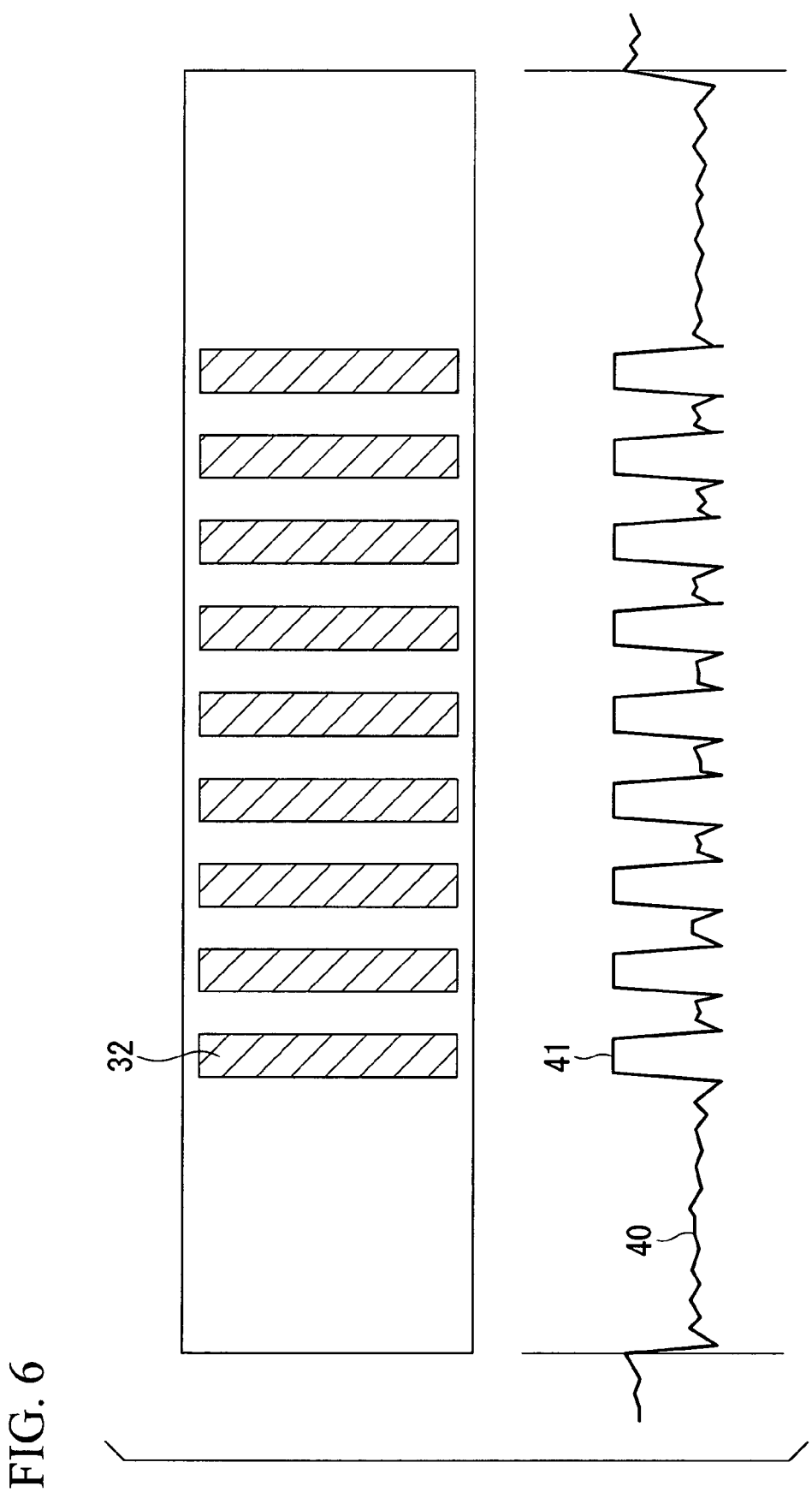
FIG. 6 is a diagram showing the results of estimation concerning contrasts with respect to alignment mark detecting light when the alignment marks are used.

FIG. 6 is a diagram showing the results of estimation concerning contrasts with respect to alignment mark detecting light when the alignment marks 32 of the present embodiment are used. Here, reference numeral 40 indicates the contrast at the noise level, and reference numeral 41 indicates the contrast measured at each alignment mark. In accordance with the shown results, it is found that when the alignment marks 32 of the present embodiment are used, uniform results can be obtained regardless of whether the chip is present at the center part or the peripheral part of the device, and clear optical contrasts can be obtained in response to the step of each alignment mark 32. In contrast, if the alignment marks are formed, not on the element-separating insulating film, but in another area (on the semiconductor substrate) other than the element-separating insulating film, then the chip positioned on the center part of the semiconductor substrate surface can provide an effect similar to the present embodiment, but the chip positioned at the periphery of the semiconductor substrate should be considerably affected by CMP. That is, light contrast at the alignment mark is degraded to the noise level, so that the alignment mark cannot be sufficiently detected. Therefore, in this case, it is difficult to solve a problem relating to a considerable decrease in the manufacturing yield.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

Figure 5:
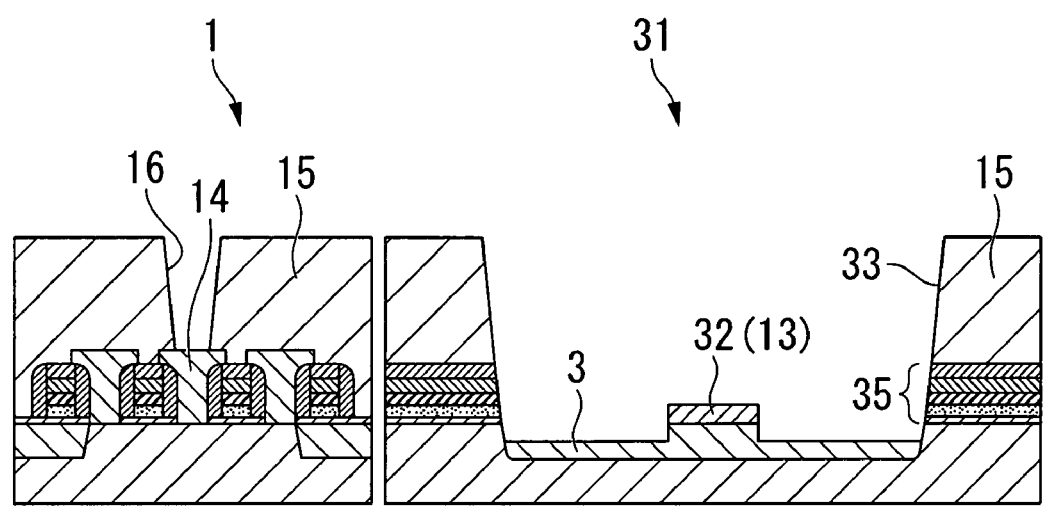
FIG. 5 is a sectional view for showing a variation of the manufacturing processes of the DRAM.

For example, in the above embodiment, the element-separating insulating film around each alignment mark is completely removed in the thickness direction. However, a part of the element-separating insulating film around each alignment mark may be removed. In this case, as shown in FIG. 5 (corresponding to the process shown in FIG. 4A), the element-separating insulating film 3 around the alignment mark 32 partially remains, so that the element-separating insulating film 3 around the alignment mark 32 is thinner than the element-separating insulating film 3 immediately below the alignment mark 32. Even in this case, if the step of the alignment mark 32 has a height for sufficient optical detection of the mark, effects similar to those obtained by the above embodiment can be obtained. In addition, specific matters in the above embodiment, such as each material, dimension, thickness, process conditions, and the like, are just examples, and may be appropriately modified. Furthermore, the present invention can be applied to semiconductor devices other than DRAMs.

What is claimed is:

1. A method of manufacturing a semiconductor device, in which on a semiconductor substrate, semiconductor elements are formed in an element forming area and an alignment mark used in photolithography is formed outside the element forming area, the method comprising the steps of:
   forming an element separating insulating film on the upper surface of the semiconductor substrate;
   forming a gate multilayer film for forming a gate electrode on the upper surface of the semiconductor substrate, which includes the area where the element separating insulating film is formed;
   selectively removing the gate multilayer film in an alignment mark forming area, which is positioned on the element separating insulating film, so that the gate multilayer film remains around the alignment mark forming area;
   forming a pattern, made by using a first conductive film, in the element forming area on the upper surface of the semiconductor substrate, and also forming the alignment mark made by using the first conductive film in the alignment mark forming area surrounded by the gate multilayer film;
   forming an inter-layer insulating film on the upper surface of the semiconductor substrate after the pattern and the alignment mark are formed;
   selectively removing the inter-layer insulating film in the alignment mark forming area, so that the inter-layer insulating film remains on the gate multilayer film around the alignment mark forming area;
   removing or thinning the element separating insulating film around the alignment mark;
   forming a pattern, made by using a second conductive film, on the inter-layer insulating film by performing alignment of the photolithography by using the alignment mark.

2. The method in accordance with claim 1, wherein the step of removing or thinning the element separating insulating film around the alignment mark is performed immediately after the selective removal of the inter-layer insulating film in the alignment mark forming area.

3. The method in accordance with claim 1, wherein the step of selectively removing the gate multilayer film in the alignment mark forming area is performed simultaneously with patterning of the gate multilayer film so as to form the gate electrode.

4. The method in accordance with claim 1, wherein:
   a word wiring line is formed using the gate multilayer film;
   a memory cell contact plug, connected to an impurity-diffused layer in the upper surface of the semiconductor substrate, is formed using the pattern made by the first conductive film; and
   a bit wiring contact plug, connected to the memory cell contact plug, is formed using the pattern made by the second conductive film.

5. The method in accordance with claim 4, wherein the step of selectively removing the inter-layer insulating film in the alignment mark forming area is performed simultaneously with formation of a contact hole for connecting the bit wiring contact plug to the memory cell contact plug through the inter-layer insulating film.

* * * * *